(12) United States Patent
Biskeborn et al.

(10) Patent No.: US 9,966,237 B2
(45) Date of Patent: May 8, 2018

(54) SYSTEM AND METHOD FOR DIFFERENTIAL ETCHING

(71) Applicant: International Business Machines Corporation, Armonk, NY (US)

(72) Inventors: Robert G. Biskeborn, Hollister, CA (US); Calvin S. Lo, Saratoga, CA (US); Cherngye Hwang, San Jose, CA (US); Andrew C. Ting, El Prado, NM (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/140,362

(22) Filed: Apr. 27, 2016

(65) Prior Publication Data
US 2016/0240355 A1 Aug. 18, 2016

Related U.S. Application Data

(63) Continuation of application No. 13/601,739, filed on Aug. 31, 2012, now Pat. No. 9,349,395.

(51) Int. Cl.
*C23C 14/34* (2006.01)
*H01J 37/32* (2006.01)
*G11B 5/31* (2006.01)
*H01J 37/34* (2006.01)

(52) U.S. Cl.
CPC ...... *H01J 37/32825* (2013.01); *G11B 5/3163* (2013.01); *H01J 37/32816* (2013.01); *H01J 37/3411* (2013.01); *H01J 2237/334* (2013.01)

(58) Field of Classification Search
CPC ........... H01J 37/32823; H01J 37/32816; H01J 37/3411; H01J 2237/335; G11B 5/3163
See application file for complete search history.

(56) References Cited

U.S. PATENT DOCUMENTS

| | | | |
|---|---|---|---|
| 3,994,793 | A | 11/1976 | Harvilchuck et al. |
| 4,082,637 | A | 4/1978 | Misiano et al. |
| 4,229,247 | A | 10/1980 | Chiu et al. |
| 4,620,898 | A | 11/1986 | Banks et al. |
| 4,918,554 | A | 4/1990 | Bajorek et al. |

(Continued)

FOREIGN PATENT DOCUMENTS

| | | |
|---|---|---|
| CN | 1675749 A | 9/2005 |
| EP | 001653450 A2 | 5/2006 |

(Continued)

OTHER PUBLICATIONS

Translation to Matsuda (JP 09-055169) published Feb. 1997.*

(Continued)

*Primary Examiner* — John J Brayton
(74) *Attorney, Agent, or Firm* — Zilka-Kotab, P.C.

(57) ABSTRACT

A plasma sputtering apparatus according to one embodiment includes a chamber and a reservoir in fluidic communication with the chamber. The reservoir stores a vapor source therein, and is configured to release vapor at a predetermined rate. The vapor released by the reservoir is effective to diminish an etch rate of a first magnetic material, the vapor having a smaller effect on an etch rate of a second magnetic material that is different than the first magnetic material. The apparatus also includes a mount for a substrate and a plasma source.

16 Claims, 6 Drawing Sheets

(56) References Cited

U.S. PATENT DOCUMENTS

| | | | |
|---|---|---|---|
| 5,188,705 A * | 2/1993 | Swanson | H01J 37/3056 204/192.34 |
| 5,403,436 A | 4/1995 | Fujimura et al. | |
| 5,606,478 A | 2/1997 | Chen et al. | |
| 5,822,153 A | 10/1998 | Lairson et al. | |
| 5,991,119 A | 11/1999 | Boutaghou et al. | |
| 6,140,655 A * | 10/2000 | Russell | H01J 37/3056 204/192.34 |
| 6,579,465 B1 | 6/2003 | Takamatsu et al. | |
| 6,580,586 B1 | 6/2003 | Biskeborn | |
| 6,667,244 B1 | 12/2003 | Cox et al. | |
| 6,687,089 B2 | 2/2004 | Chiba et al. | |
| 6,858,537 B2 | 2/2005 | Brewer | |
| 7,023,658 B1 | 4/2006 | Knapp et al. | |
| 7,508,624 B1 | 3/2009 | Lauer | |
| 7,532,434 B1 | 5/2009 | Schreck et al. | |
| 7,807,579 B2 | 10/2010 | Yang et al. | |
| 9,001,463 B2 | 4/2015 | Biskeborn et al. | |
| 9,349,395 B2 * | 5/2016 | Biskeborn | G11B 5/3163 |
| 9,472,213 B2 | 10/2016 | Biskeborn et al. | |
| 9,886,972 B2 | 2/2018 | Biskeborn et al. | |
| 2002/0024755 A1 | 2/2002 | Kim et al. | |
| 2003/0180495 A1 * | 9/2003 | Ito | B25B 11/005 428/64.4 |
| 2003/0227716 A1 | 12/2003 | Yamakura et al. | |
| 2005/0264930 A1 | 12/2005 | Gider et al. | |
| 2007/0081278 A1 | 4/2007 | Feldbaum et al. | |
| 2008/0112076 A1 | 5/2008 | Biskeborn | |
| 2008/0261405 A1 | 10/2008 | Yang et al. | |
| 2008/0266711 A1 | 10/2008 | Nibarger et al. | |
| 2008/0278854 A1 | 11/2008 | Biskeborn | |
| 2008/0314736 A1 | 12/2008 | Biskeborn et al. | |
| 2009/0015970 A1 | 1/2009 | Biskeborn et al. | |
| 2009/0052093 A1 | 2/2009 | Kawakita et al. | |
| 2009/0251828 A1 | 10/2009 | Schreck et al. | |
| 2010/0007976 A1 | 1/2010 | Baumgart et al. | |
| 2010/0062608 A1 | 3/2010 | Hopfe et al. | |
| 2012/0189946 A1 | 7/2012 | Hashimoto et al. | |
| 2014/0061033 A1 | 3/2014 | Biskeborn et al. | |
| 2014/0063646 A1 | 3/2014 | Biskeborn et al. | |
| 2015/0199984 A1 | 7/2015 | Biskeborn et al. | |
| 2017/0004849 A1 | 1/2017 | Biskeborn et al. | |
| 2018/0068678 A1 | 3/2018 | Biskeborn et al. | |

FOREIGN PATENT DOCUMENTS

| | | | |
|---|---|---|---|
| EP | 1850334 A1 | | 10/2007 |
| JP | 09055169 A | * | 2/1997 |
| JP | 2008277812 A | | 11/2008 |

OTHER PUBLICATIONS

Nguyen, Sonca T. et al. Operating a radio-frequency plasma source on water vapor, Review of Scientific Instruments 80, 083503 (2009).*

Notice of Allowance from U.S. Appl. No. 14/668,860, dated Jul. 6, 2016.
Notice of Allowance from U.S. Appl. No. 13/601,117, dated Nov. 28, 2014.
Biskeborn et al., U.S. Appl. No. 14/668,860, filed Mar. 25, 2015.
Biskeborn et al., U.S. Appl. No. 13/601,117, filed Aug. 31, 2012.
Biskeborn et al., U.S. Appl. No. 13/601,739, filed Aug. 31, 2012.
Nikitin et al., "Spatial and temporal profiling of protrusion in magnetic recording heads," IEEE Transactions on Magnetics, vol. 40, No. 1, Jan. 2004, pp. 326-331.
Non-Final Office Action from U.S. Appl. No. 13/601,117, dated Mar. 13, 2014.
Restriction from U.S. Appl. No. 13/601,117, dated Jan. 21, 2014.
Final Office Action from U.S. Appl. No. 13/601,117, dated Sep. 17, 2014.
Non-Final Office Action from U.S. Appl. No. 13/601,739, dated Mar. 24, 2015.
Election/Restriction Requirement from U.S. Appl. No. 13/601,117, dated Jan. 21, 2014.
Election/Restriction Requirement from U.S. Appl. No. 14/668,860, dated Jul. 6, 2015.
Konuma et al., "Water vapor controlling selective reactive ion etching of SiO2/Si in NF3 plasma", Journal of Applied Physics, vol. 74 Issue 3, Aug. 1993, pp. 1575-1578.
Non-Final Office Action from U.S. Appl. No. 13/601,739, dated Oct. 15, 2015.
Sandmeyer Steel Company, "Specification Sheet: Alloy 310/310S/ 310H: A Multi-Purpose Austenitic Heat Resistant Stainless Steel with Oxidation Resistance Under Mildly Cyclic Conditions to 2010° F.," retrieved from www.sandmeyersteel.com/images/310-Spec-Sheet.pdf, Jun. 2014, 2 pages.
Non-Final Office Action from U.S. Appl. No. 14/668,860, dated Sep. 29, 2015.
Final Office Action from U.S. Appl. No. 13/601,739, dated Dec. 23, 2015.
Advisory Action from U.S. Appl. No. 13/601,739, dated Jan. 25, 2016.
Notice of Allowance from U.S. Appl. No. 13/601,739, dated Mar. 2, 2016.
Final Office Action from U.S. Appl. No. 14/668,860, dated Apr. 15, 2016.
Biskeborn et al., U.S. Appl. No. 15/260,115, filed Sep. 8, 2016.
Final Office Action from U.S. Appl. No. 15/260,115, dated Jul. 24, 2017.
Non-Final Office Action from U.S. Appl. No. 15/260,115, dated Jan. 26, 2017.
Notice of Allowance from U.S. Appl. No. 15/260,115, dated Sep. 27, 2017.
Biskeborn et al., U.S. Appl. No. 15/808,796, filed Nov. 9, 2017.
Supplemental Notice of Allowance from U.S. Appl. No. 15/260,115, dated Dec. 19, 2017.

* cited by examiner

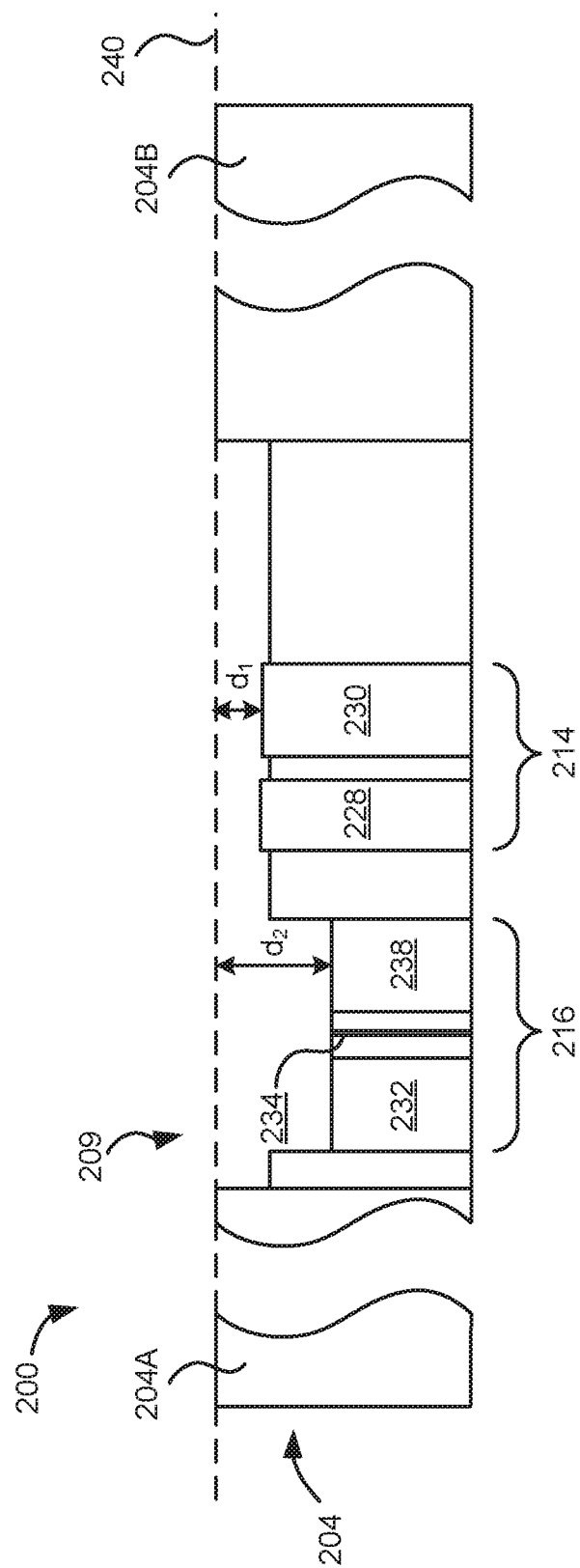

SYSTEM AND METHOD FOR DIFFERENTIAL ETCHING

BACKGROUND

The present invention relates to selectively etching portions of a substrate, and more particularly, this invention relates to a system and method for controlling the differential etch rate difference between one or more materials of a substrate.

Techniques for etching substrates, such as microelectronic devices, magnetic heads, etc., are known in the art. Conventional etching processes include, for example, inert gas plasma sputtering, ion milling or reactive ion etching, etc. In these processes, etching occurs as a result of physical impingement of ions on the surface of the substrate to be etched, or as a result of interaction between the impingement ions and the etched surface, or both. However, only small differential etch rates have been achieved in these processes, by varying the impingement angle.

BRIEF SUMMARY

A plasma sputtering apparatus according to one embodiment includes a chamber and a reservoir in fluidic communication with the chamber. The reservoir stores a vapor source therein, and is configured to release vapor at a predetermined rate. The vapor released by the reservoir is effective to diminish an etch rate of a first magnetic material, the vapor having a smaller effect on an etch rate of a second magnetic material that is different than the first magnetic material. The apparatus also includes a mount for a substrate and a plasma source.

A plasma sputtering apparatus according to another embodiment includes a chamber and a reservoir in fluidic communication with the chamber. The reservoir is configured to release a vapor at an established rate. The reservoir comprises a porous material selected from the group consisting of: a metal oxide, silicon nitride, silicon carbide, and combinations thereof. The apparatus also includes a mount for a substrate and a plasma source.

Other aspects and embodiments of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

FIG. 2B is a partial cross-sectional view of a module according to one embodiment.

DETAILED DESCRIPTION

Figure 1:
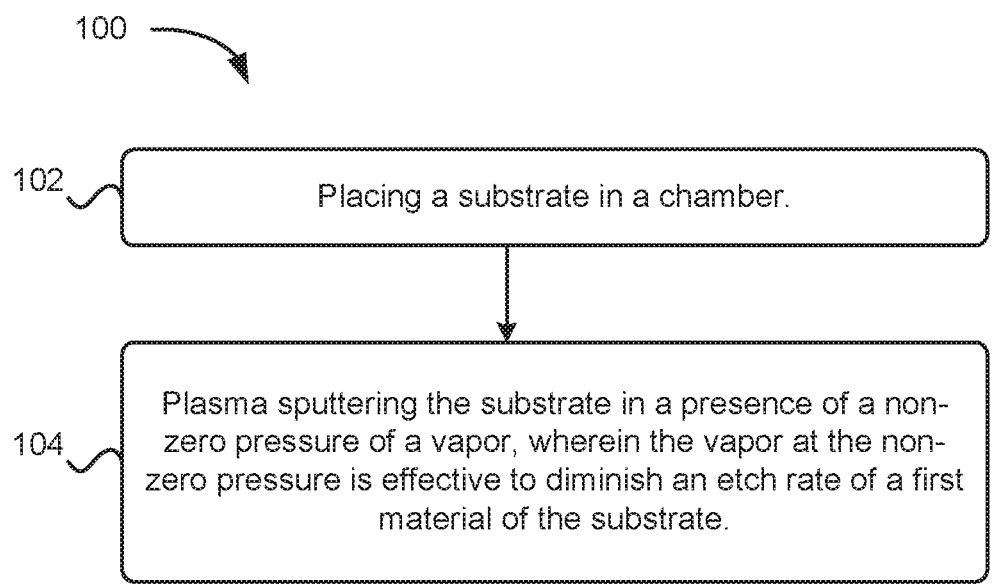
FIG. 1 is a flow diagram of a method according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of the present invention, as well as operation and/or component parts thereof.

In one general embodiment, a method includes placing a substrate in a chamber; and plasma sputtering the substrate in a presence of a non-zero pressure of a vapor, wherein the vapor at the non-zero pressure is effective to diminish an etch rate of a first material of the substrate.

In another general embodiment, a method includes placing a substrate in a chamber, wherein the substrate includes a magnetic head; and plasma sputtering the substrate in a presence of a non-zero pressure of a vapor, wherein the vapor at the non-zero pressure is effective to diminish an etch rate of at least one write pole of the magnetic head, wherein the presence of the vapor has a smaller effect on an etch rate of at least one reader shield of the magnetic head.

In one general embodiment, a plasma sputtering apparatus includes a chamber; a reservoir in the chamber for releasing a vapor at an established rate; a mount for a substrate; and a plasma source.

In conventional high vacuum etching processes, e.g. inert gas plasma sputtering, ion milling, reactive ion etching, etc., etching typically occurs as a result of physical impingement of ions on the surface to be etched, as a result of interaction between the impingement ions and the etched surface, etc. While the impingement angle is often varied in these conventional etching processes to etch certain classes of materials at different rates, only small differential rates have been achieved.

Embodiments of the present invention overcome the aforementioned drawback by providing a system and method for altering susceptibility to etching via selective in-situ interactions between a selected material and etching inhibiting agent to achieve large differential etching rates. For example, a surface chemistry reaction may be utilized in some embodiments to diminish the etch rates for specific materials. Preferably, the overall etch rate may be low to allow a surface interaction to be more effective for some materials than other, in some embodiments.

In preferred embodiments, the system and method may be used for profiling magnetic recording head surfaces to minimize surface shorting due to permalloy (nickel-iron alloy) smearing. For instance, etching may be performed to recess the ductile permalloy below the sensor layers according to various embodiments.

Further, the inventors were surprised to discover that when the etching is performed in the presence of water vapor as described in the embodiments herein, unexpected and surprising results manifest, including a large observable shift in etch rates for certain materials and not others. Unlike previously known etching methods and systems where water vapor is intentionally thoroughly pumped out of the vacuum system, preferred embodiments of the present invention etch or profile a substrate in the presence of a selected and controlled pressure of water vapor.

While the precise mechanism that enables control of the relative etching rates was previously unrecognized, and could not have been predicted, without wishing to be bound by any theory, it is presently hypothesized that the water vapor has an affinity to iron, where the water and/or oxygen species may bind to or otherwise react with the alloy in proportion to the iron content. It is believed that the higher the iron content, the more the water vapor tends to aggregate at the surface of the alloy, thereby providing a barrier at the molecular level to the incoming ions and consequently retarding the etch rate.

The approaches presented herein are applicable to a wide variety of processes for fabricating any type of device, including magnetic heads, sensors, circuits, chips, processors, etc. To place various embodiments in a context, and done solely by way of example and not limitation, several embodiments are described in terms of processing a magnetic head. Again, this is done by way of example to assist the reader, and those skilled in the art of thin film and/or semiconductor processing will appreciate the plethora of possible applications of the teaching herein.

In one illustrative example, at least one write pole comprising a higher iron-containing nickel-iron alloy (e.g., 45 at % Ni/55 at % Fe) may etch at rate that is substantially slower, e.g. up to about 9 times slower, than at least one permalloy (e.g., 80/20 NiFe) reader shield during plasma sputter etching, also referred to herein as plasma sputtering. This unexpected and surprising result—the large differential etching in the presence of the water vapor—enables achieving essentially zero recession write poles in addition to achieving the original intended purpose of protecting the sensor from surface smearing by selectively recessing portions of the sensor.

Additionally, in preferred embodiments, the system and method may provide a means for controlling water vapor pressure in a system capable of producing a high vacuum, such as is required for sputter deposition of thin film layers. Particularly, exemplary embodiments may provide a porous aluminum oxide structure to serve as a reservoir for water, which may subsequently release water at an established rate during etching and/or the pumping down of the vacuum system. In one embodiment, the structure is proximate to or serves as a pallet for holding the substrate or substrates.

The rate at various pressures may be established via known techniques using routine experimentation, as would be apparent to one skilled in the art upon reading the present disclosure. Furthermore, the claimed system and method may support etching with, or in the absence of, hydrogen gas.

FIG. 1 shows a method 100 in accordance with one embodiment. As an option, the present method 100 may be implemented in conjunction with features from any other embodiments listed herein, such as those shown in the other FIGS. Of course, however, this method 100 and others presented herein may be used in various applications and/or permutations, which may or may not be related to the illustrative embodiments listed herein. Further, the method 100 presented herein may be carried out in any desired environment. Moreover, more or less operations than those shown in FIG. 1 may be included in method 100, according to various embodiments.

As shown in FIG. 1 according to one approach, the method 100 includes placing a substrate in a chamber. See operation 102. The method 100 also includes plasma sputtering the substrate in a presence of a non-zero pressure of a vapor, where the vapor at the non-zero pressure is effective to diminish an etch rate of a first material of the substrate. See operation 104. As used herein, the vapor may include, but is not limited to, water vapor.

According to one embodiment, the plasma sputtering may be performed in a vacuum.

In another embodiment, the vapor may be released during a pump-down procedure for creating the vacuum.

Preferably, the vapor may originate from a reservoir in the chamber. The reservoir may include a porous structure, in accordance with one approach. The porous structure may comprise porous materials including, but not limited to, ceramics; metal oxides such as aluminum oxide, titanium oxide; zirconium dioxide (zirconia); silicon nitride, silicon carbide; etc. or other porous materials suitable to contain and release vapor (e.g. water vapor) as would be understood by one having skill in the art upon reading the present disclosure. In some embodiments, the porous structure is an oxygenated material that may release oxygen during the sputtering process. Oxygen may assist in the effect of the water. The reservoir may be a flame coated substrate employing any of the foregoing materials. The reservoir may be positioned anywhere in the chamber, such as along one side of the chamber, over or under the substrate, in or along the mount, etc., or in some embodiments incorporated with the pallet used to hold the substrate, thereby providing a local source of water vapor.

In another approach, the reservoir could be external to the chamber, and the water vapor injected into the chamber in a controlled manner.

The reservoir, according to another approach, may release the vapor at known rates at particular vacuum pressures.

The pressure of the water vapor in the chamber generally refers to the pressure of the water vapor which is being released by the reservoir. Several exemplary pressures of the vapor are presented herein, and are generally suitable for etching where the temperature of the substrate is to be kept below 70° C., However, it should be kept in mind that the pressure may be adjusted to values above and/or below the disclosed values depending on the plasma energy and/or the accelerating voltage used in a given process. One skilled in the art, upon being apprised of the teachings herein, could determine workable ranges without undue experimentation.

In one illustrative approach, the non-zero pressure of the water vapor may be achieved at pressures greater than $10^{-7}$ Torr. In a preferred embodiment, the pressure of the vapor may be between $10^{-5}$ and $10^{-7}$ Torr, depending on the plasma energy. This range has been found to provide the surprising and unexpected result of differential etching rates of layers having different iron composition. Those skilled in the art, now being apprised of the present disclosure, would be able to extend the teachings presented herein to other materials systems to determine water vapor pressures that afford similar differential etching rates for such materials systems without undue experimentation.

In a further embodiment, a desired amount of water vapor in the chamber may be based on an impingement ratio. As used herein, the impingement ratio may be defined as the number of vapor molecules striking the substrate per unit of time divided by the number of plasma ions striking the substrate per unit time, where the numbers of molecules and atoms can be estimated or calculated using any known method.

Additionally, in one embodiment, substantially no hydrogen gas may be present in the chamber during the plasma sputtering. This statement encompasses presence of trace amounts (e.g., below 1 at %) of hydrogen due, for instance, to a trace presence of hydrogen in a feed gas. Further, the present of trace amounts of hydrogen in the chamber may be due to the inherent inability to remove every atom of all substances from the chamber during the pump down procedure of the chamber, etc.

According to various approaches, hydrogen gas may or may not be (purposefully) added to the chamber during the plasma sputtering. The plasma may include an ionized noble gas, such as argon, and so a sputtering target is not required.

The method 100 may further comprise forming portions of the substrate in the chamber prior to and/or after the plasma sputtering, in one embodiment. For example, a coating may be added to the device after the plasma sputtering.

In another embodiment, the substrate may include a first material. According to one approach, the first material of the substrate may be an alloy comprising a first concentration of iron. In yet another embodiment, the substrate may also include a second material, wherein the second material of the substrate may be an alloy comprising a second concentration of iron different than the first concentration of iron of the first material. For example, the first material may comprise greater than 30 at % iron and the second material may comprise less than 30 at % iron, in one approach. In a preferred approach, the first material may comprise approximately 45 at % nickel and 55 at % iron, and the second material may comprise approximately 80 at % nickel and 20 at % iron. In another exemplary approach, the first material may comprise Al—Fe—Si (Sendust), where the iron is approximately 81 at %. Sendust is not ductile and is wear resistant; thus the first material comprising Sendust may provide additional durability, in some embodiments. For instance, said additional durability may protect against tape wear in magnetic heads, especially for those having little or no Sendust recession.

In a further embodiment, the second material may be exposed to the plasma sputtering, where the presence of the vapor may have a reduced, and preferably negligible, effect on an etch rate of the second material. As used herein, negligible signifies that the etch rate is within 20% of what the etch rate would be in the absence of the vapor.

However, in one approach, the etch rate of the first material may be diminished by at least 2 times in the presence of the vapor. According to another approach, the etch rate of the first material may be diminished by more than 4 times, e.g., at least 5 times, at least 6 times, at least 7 times, at least 8 times, at least 9 times, etc. For instance, in a preferred approach where the first material may comprise 45 at % nickel and 55 at % iron, and the second material may comprise 80 at % nickel and 20 at % iron, the first material may be etched at a rate up to about 9 times slower than that of the second material. As described above, the diminishment of the etch rate of the first material in the presence of vapor is an unexpected and surprising result.

Figure 2:
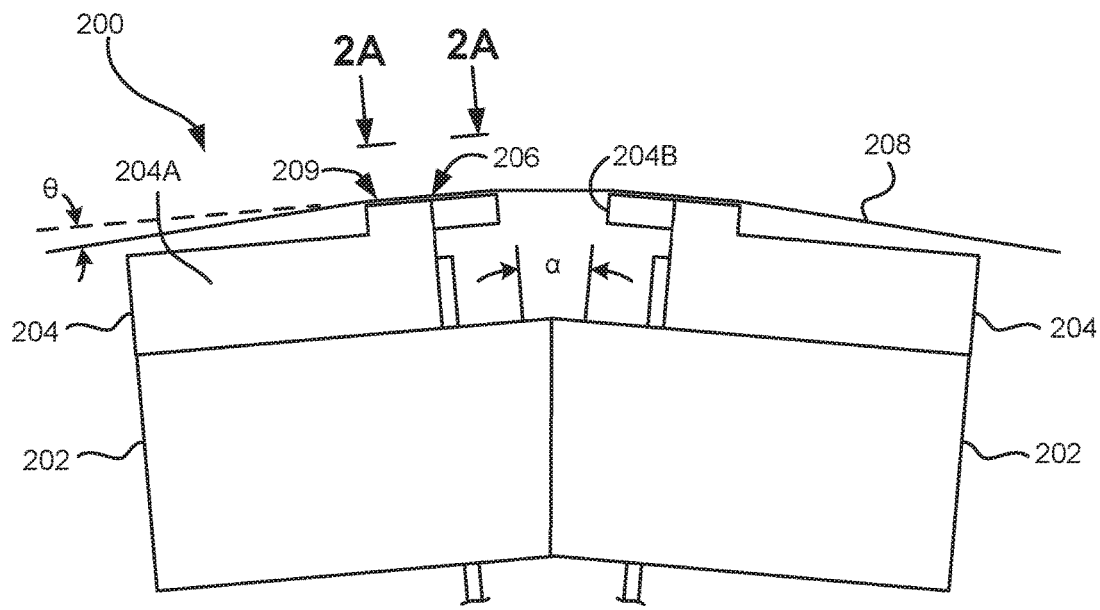
FIG. 2 illustrates a side view of a flat-lapped, bi-directional, two-module magnetic tape head according to one embodiment

In addition, the substrate of method 100 may include a magnetic head, as shown in FIG. 2 according to one embodiment. In one approach, the at least one shield of the magnetic head may be formed of the second material, wherein at least one write pole of the magnetic head may be formed of the first material.

By way of example, FIG. 2 illustrates a side view of a flat-lapped, bi-directional, two-module magnetic tape head 200, which may be implemented in the context of the present invention. As shown, the head includes a pair of bases 202, each equipped with a module 204, and fixed at a small angle α with respect to each other. The bases may be "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between about 0.1 degree and about 5 degrees.

The substrates 204A are typically constructed of a wear resistant material, such as a ceramic. The closures 204B made of the same or similar ceramic as the substrates 204A.

The readers and writers may be arranged in a piggyback or merged configuration. An illustrative piggybacked configuration comprises a (magnetically inductive) writer transducer on top of (or below) a (magnetically shielded) reader transducer (e.g., a magnetoresistive reader, etc.), wherein the poles of the writer and the shields of the reader are generally separated. An illustrative merged configuration comprises one reader shield in the same physical layer as one writer pole (hence, "merged"). The readers and writers may also be arranged in an interleaved configuration. Alternatively, each array of channels may be readers or writers only. Any of these arrays may contain one or more servo track readers for reading servo data on the medium.

Figure 2A:
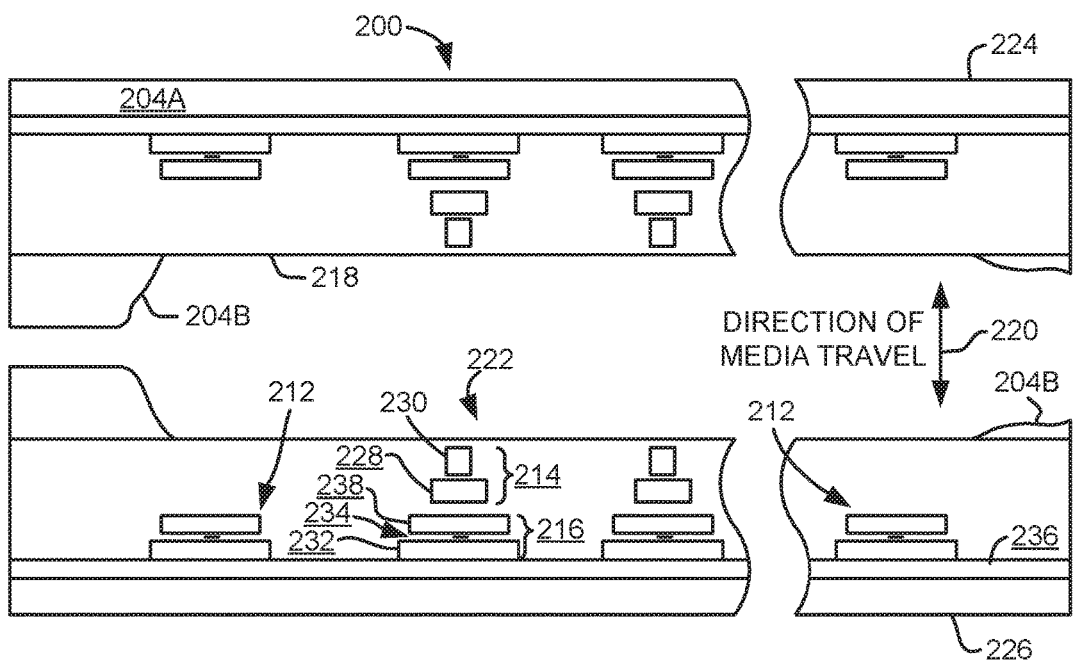
FIG. 2A is a detailed view of a partial tape bearing surface of a pair of modules.

FIG. 2A shows a partial tape bearing surface view of complimentary modules of a magnetic tape head 200 according to one embodiment. In this embodiment, each module has a plurality of read/write (R/W) pairs in a piggyback configuration formed on a common substrate 204A and an optional electrically insulative layer 236. The writers, exemplified by the write head 214 and the readers, exemplified by the read head 216, are aligned parallel to a direction of travel of a tape medium thereacross to form an R/W pair, exemplified by the R/W pair 222.

Several R/W pairs 222 may be present, such as 8, 16, 32 pairs, etc. The R/W pairs 222 as shown are linearly aligned in a direction generally perpendicular to a direction of tape travel thereacross. However, the pairs may also be aligned diagonally, etc. Servo readers 212 are positioned on the outside of the array of R/W pairs, the function of which is well known.

Generally, the magnetic tape medium moves in either a forward or reverse direction as indicated by arrow 220. The magnetic tape medium and head assembly 200 operate in a transducing relationship in the manner well-known in the art. The piggybacked MR head assembly 200 includes two thin-film modules 224 and 226 of generally identical construction.

Modules 224 and 226 are joined together with a space present between closures 204B thereof (partially shown) to form a single physical unit to provide read-while-write capability by activating the writer of the leading module and reader of the trailing module aligned with the writer of the leading module parallel to the direction of tape travel relative thereto. When a module 224, 226 of a piggyback head 200 is constructed, layers are formed in a gap 218 created above an electrically conductive substrate 204A (partially shown), e.g., of AlTiC, in generally the following order for the R/W pairs 222: an insulating layer 236, a first shield 232 typically of an iron alloy such as NiFe (permalloy), CZT or Al—Fe—Si (Sendust), a sensor 234 for sensing a data track on a magnetic medium, a second shield 238 typically of a nickel-iron alloy (e.g., ~80/20 at % permalloy), first and second writer pole tips 228, 230, and a coil (not shown). The sensor may be of any known type, including those based on MR such as GMR, AMR, tunnelling magnetoresistance (TMR), etc.

The first and second writer poles 228, 230 may be fabricated from high magnetic moment materials such as ~45/55 at % NiFe. Note that these materials are provided by way of example only, and other materials may be used. Additional layers such as insulation between the shields and/or pole tips and an insulation layer surrounding the sensor may be present. Illustrative materials for the insulation include alumina and other oxides, insulative polymers, etc.

FIG. 2B illustrates exemplary result of a plasma sputtering process on a magnetic head such as that shown in FIG. 2A having permalloy shields and 45/55 NiFe write poles. As shown in FIG. 2B, the one or more write transducers 214 may include first and second write poles, 228 and 230, respectively, having media facing sides that may be recessed a depth $d_1$ from a plane 240 extending along the media facing side 209 of the module 204, according to one embodiment. In various approaches, it may be favorable to minimize the spacing loss between the one or more write transducers 214 and the media, e.g. tape or disc, in order to maximize the accuracy of the one or more write transducers 214. Accordingly, it may be preferable, in certain approaches, to minimize the recession of the one or more write transducers 214 from the plane 240.

With continued reference to FIG. 2B, the media facing side of the first shield 232 and the second shield 238 of the one or more read transducers 216 may be recessed a depth $d_2$ from the plane 240, in accordance with one embodiment. In some approaches, the recession of the one or more shields (e.g. 232 and 238) of the one or more read transducers 216 may be favorable to protect the read sensor 234 from wear.

Figure 3:
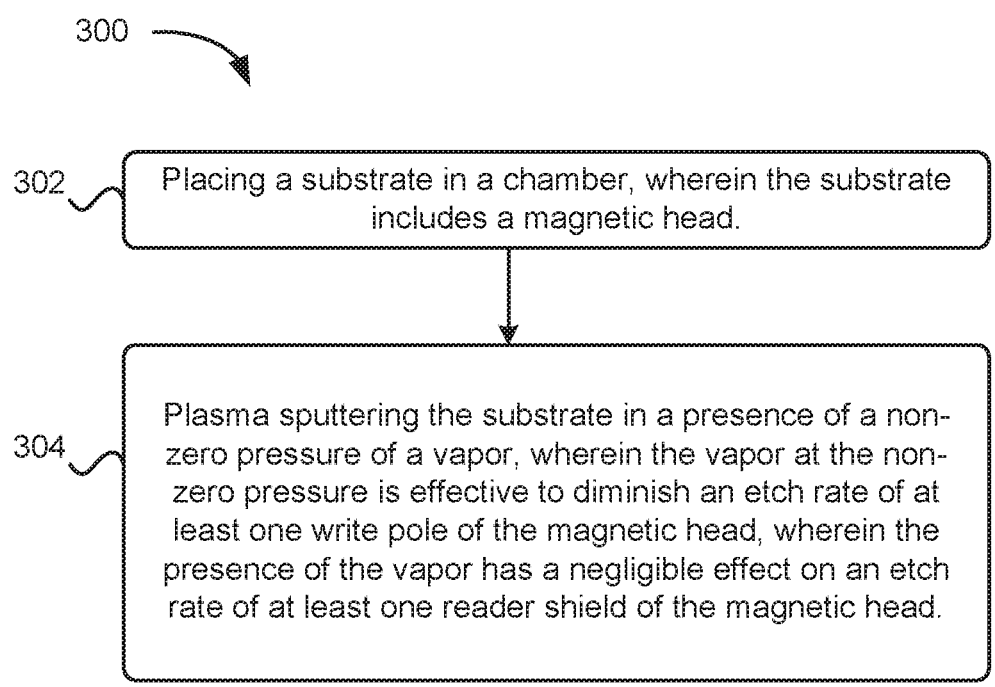
FIG. 3 is a flow diagram of a method according to one embodiment.

Referring now to FIG. 3, a method 300 is shown in accordance with one embodiment. As an option, the present method 300 may be implemented in conjunction with features from any other embodiments listed herein, such as those shown in the other FIGS. Of course, however, this method 300 and others presented herein may be used in various applications and/or permutations, which may or may not be related to the illustrative embodiments listed herein. Further, the method 300 presented herein may be carried out in any desired environment. Moreover, more or less operations than those shown in FIG. 3 may be included in method 300, according to various embodiments.

As shown in FIG. 3 according to one approach, the method 100 includes placing a substrate in a chamber, wherein the substrate includes a magnetic head. See operation 302. Additionally, the method 300 includes plasma sputtering the substrate in a presence of a non-zero pressure of a vapor, where the vapor at the non-zero pressure is effective to diminish an etch rate of at least one write pole of the magnetic head, wherein the presence of the vapor has a reduced, and preferably negligible, effect on an etch rate of at least one reader shield of the magnetic head. See operation 304. Of particular note is the unexpected and surprising diminishment of the etch rate of the at least one write pole of the magnetic head in the presence of the non-zero pressure of the vapor.

According to one embodiment, the plasma sputtering may be performed in a vacuum.

In some approaches, hydrogen gas may be present in the chamber during plasma sputtering.

In another embodiment, substantially no hydrogen gas may be present in the chamber during the plasma sputtering. This statement encompasses presence of trace amounts (e.g., below 1 at %) of hydrogen due, for instance, to a trace presence of hydrogen in a feed gas. Further, the present of trace amounts of hydrogen in the chamber may be due to the inherent inability to remove every atom of all substances from the chamber during the pump down procedure of the chamber, etc.

In yet another embodiment, the vapor, e.g. water vapor, may originate from a reservoir in the chamber. The reservoir may include a porous structure, in accordance with one approach. The porous structure may comprise porous materials including, but not limited to, ceramics; metal oxides such as aluminum oxide, titanium oxide; zirconium dioxide (zirconia); silicon nitride; silicon carbide; etc. other porous materials suitable to contain vapor (e.g. water vapor) as would be understood by one having skill in the art upon reading the present disclosure.

The reservoir may release the vapor at known rates at particular vacuum pressures, according to another approach. In yet another approach, the pressure of the vapor may be between $10^{-5}$ and $10^{-7}$ Torr. In a preferred embodiment, the pressure of the vapor may be less than $10^{-7}$ Torr, depending on the plasma energy.

In a further embodiment, the at least one write pole of the magnetic head may comprise an alloy comprising a first concentration of iron. Additionally, the at least one reader shield of the magnetic head may comprise an alloy comprising a second concentration of iron different than the first concentration of iron in the at least one write pole, in one approach. For example, the at least one reader shield may comprise greater than 30 at % iron and the at least one write pole may comprise less than 30 at % iron, in another approach. In a preferred approach, the at least one write pole may comprise 45 at % nickel and 55 at % iron, and the at least one reader shield may comprise 80 at % nickel and 20 at % iron. In another exemplary approach, the at least one write pole may comprise Al—Fe—Si (Sendust), where the iron is approximately 81 at %.

According to one embodiment, the etch rate of the at least one write pole may be diminished by at least 2-3 times. According to another embodiment, the etch rate of the at least one write pole may be diminished by at least 6 times, 7 times, 8 times, etc. For instance, in a preferred approach where the at least one write pole may comprise 45 at % nickel and 55 at % iron, and the at least one reader shield may comprise 80 at % nickel and 20 at % iron, the at least one write pole may be etched at a rate of about 9 times slower than that of the at least one reader shield.

Figure 4:
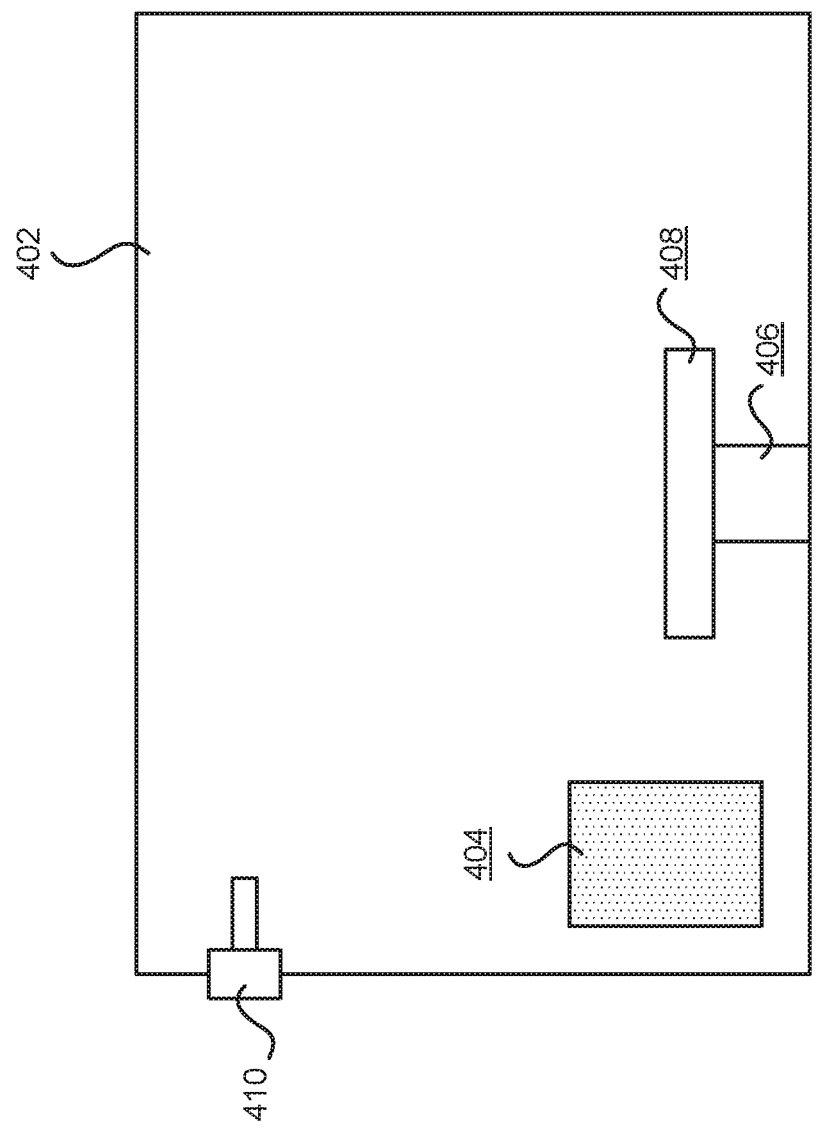
FIG. 4 illustrates a schematic diagram of a plasma sputtering apparatus according to one embodiment.

Referring now to FIG. 4, a schematic diagram of a plasma sputtering apparatus 400 is shown in accordance with one embodiment. As an option, the present apparatus 400 may be implemented in conjunction with features from any other embodiment listed herein, such as those described with reference to the other FIGS. Of course, however, such apparatus 400 and others presented herein may be used in various applications and/or in permutations, which may or may not be specifically described in the illustrative embodiments listed herein. Further, the apparatus 400 presented herein may be used in any desired environment.

As shown if FIG. 4 according to one approach, the plasma sputtering apparatus 400 may include a chamber 402. The plasma sputtering apparatus 400 may also include a reservoir 404 in the chamber 402 for releasing vapor at an established rate. In one approach, the vapor may be released at particular vacuum pressures. For example, in one embodiment, the vapor may be released until the pressure of the vapor is less than $10^{-7}$ Torr.

The plasma sputtering apparatus 400 may additionally include a mount 406 for a substrate 408. In one embodiment, the substrate 408 may include a first material. According to another embodiment, the first material of the substrate may be an alloy comprising a first concentration of iron. In yet another embodiment, the substrate 408 may also include a second material, wherein the second material of the substrate may be an alloy comprising a second concentration of iron different than the first material's concentration of iron. For example, the first material may comprise greater than 30 at % iron and the second material may comprise less than 30 at % iron, in one approach.

In a further embodiment, the presence of the vapor may diminish an etch rate of the first material of the substrate 408. Additionally, the presence of the vapor may have a negligible effect on an etch rate of the second material, in one approach. For example, the etch rate of the first material may be at least 2 times, at least 5 times, 6 times, 7 times, 8 times, etc. slower than the etch rate of the second material, in another approach. In a preferred approach, where the first material of the substrate 408 may comprise 45 at % nickel and 55 at % iron, and the second material of the substrate 408 may comprise 80 at % nickel and 20 at % iron, the first material may be etched at a rate of about 9 times slower than that of the second material.

Furthermore, the substrate 408 may include a magnetic head, such as the magnetic head illustrated in FIG. 2B according to one embodiment. According to one approach, the at least one shield of the magnetic head may be formed of the second material, where at least one write pole of the magnetic head may formed of the first material.

With continued reference to FIG. 4, the plasma sputter may include a plasma source 410 of any known type. In one embodiment, the plasma may include ionized argon. In another embodiment, the plasma may be excited using a radio frequency (RF), direct current (DC), microwave (MW), etc. energy source.

Figure 5A:
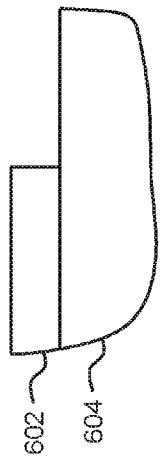
FIGS. 5A-5C depict results of etching processes according to one embodiment.
Figure 5B:
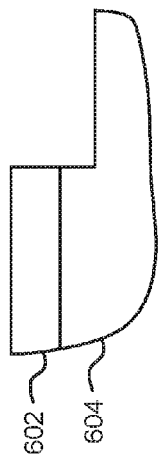
Figure 5C:
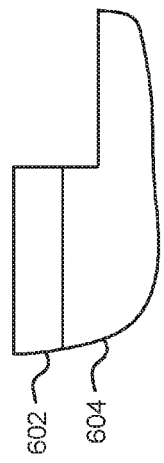
Figure 6A:
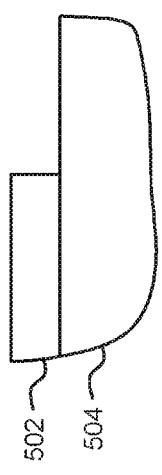
FIGS. 6A-6C depict results of etching processes according to one embodiment.
Figure 6B:
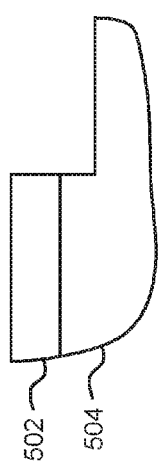
Figure 6C:
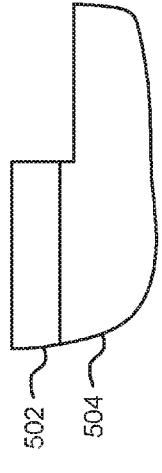

FIGS. 5A-5C and 6A-6C demonstrate different etch rates for different materials. In FIG. 5A, a layer 502 of an iron alloy having greater than 30 at % iron is shown with a mask 504 covering a portion thereof. FIG. 5B illustrates the result of etching of the layer 502 in the absence of water vapor. FIG. 5C illustrates the result of etching the layer 502 in the presence of water vapor having a pressure above $10^{-7}$ Torr under otherwise identical conditions as those used in FIG. 5B. In FIG. 6A, a layer 602 of an iron alloy having less than 30 at % iron is shown with a mask 604 covering a portion thereof. FIG. 6B illustrates the result of etching of the layer 602 in the absence of water vapor under identical conditions as used in FIG. 5B. FIG. 6C illustrates the result of etching the layer 602 in the presence of water vapor having a pressure above $10^{-7}$ Torr under identical conditions as those used in FIG. 5C. Note that the recession was retarded in FIG. 5C by the water vapor, but was minimally retarded in FIG. 6C.

It will be clear that the various features of the foregoing systems and/or methodologies may be combined in any way, creating a plurality of combinations from the descriptions presented above.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A plasma sputtering apparatus, comprising:
a chamber;
a reservoir in fluidic communication with the chamber;
a vapor source in the reservoir, the reservoir being physically configured to release vapor from the vapor source at a predetermined rate, the vapor source being for producing the vapor for diminishing an etch rate of a first magnetic material, the vapor having a smaller effect on an etch rate of a second magnetic material that is different than the first magnetic material;
a mount for a substrate; and
a plasma source for generating an ionized noble gas,
wherein the reservoir comprises, in addition to the vapor source, an oxygenated material configured to release oxygen during plasma sputtering,
wherein the oxygenated material is in the form of a porous structure, the vapor source being positioned in pores of the porous structure.

2. The apparatus of claim 1, wherein the substrate includes a magnetic head, wherein at least one shield of the magnetic head is formed of the second magnetic material, wherein at least one write pole of the magnetic head is formed of the first magnetic material.

3. The apparatus of claim 1, wherein the vapor is water vapor.

4. The apparatus of claim 1, wherein the reservoir is configured to release the vapor during a pump-down procedure for creating a vacuum in the chamber.

5. The apparatus of claim 1, comprising the substrate having the first and second magnetic materials, wherein the vapor released by the reservoir is physically characterized as effective to diminish the etch rate of the first magnetic material that is an alloy comprising a first concentration of iron, wherein the vapor is physically characterized as having a smaller effect on the etch rate of the second magnetic material that is an alloy comprising a second concentration of iron that is different than the first concentration of iron.

6. The apparatus of claim 5, wherein the first magnetic material comprises greater than 30% iron, wherein the second magnetic material comprises less than 30% iron.

7. The apparatus of claim 1, wherein the vapor from the vapor source reduces the etch rate of the first magnetic material by at least 2 times relative to an etch rate thereof in an absence of the vapor.

8. A plasma sputtering apparatus, comprising:
a chamber;
a reservoir in fluidic communication with the chamber, the reservoir being configured to release a vapor at an established rate, wherein the reservoir comprises a porous material selected from the group consisting of: a metal oxide, silicon nitride, and combinations thereof;
a mount for a substrate; and
a plasma source for generating an ionized noble gas,
wherein the porous material has pores for receiving a vapor source therein, wherein the porous material comprises an oxygenated material configured to release oxygen during plasma sputtering.

9. The apparatus of claim 8, comprising the vapor in the reservoir.

10. The apparatus of claim 8, wherein the porous material is positioned to hold the substrate during plasma sputtering.

11. The apparatus of claim 8, comprising a vapor source in pores of the porous material.

12. The apparatus of claim 8, wherein the vapor is water vapor.

13. The apparatus of claim 8, wherein the reservoir is configured to release the vapor during a pump-down procedure for creating a vacuum in the chamber.

14. The apparatus of claim 9, wherein the vapor stored in the reservoir is for diminishing an etch rate of a first magnetic material, the vapor having a smaller effect on an etch rate of a second magnetic material, wherein the first magnetic material is an alloy comprising a first concentration of iron, wherein the second magnetic material is an alloy comprising a second concentration of iron that is different than the first concentration of iron.

15. The apparatus of claim 9, wherein the vapor stored in the reservoir is for diminishing an etch rate of a first magnetic material, the vapor having a smaller effect on an etch rate of a second magnetic material, wherein the first magnetic material comprises greater than 30% iron, wherein the second magnetic material comprises less than 30% iron.

16. The apparatus of claim 9, wherein the vapor stored in the reservoir is for diminishing an etch rate of a first magnetic material, the vapor having a smaller effect on an etch rate of a second magnetic material, wherein the vapor is effective to reduce the etch rate of the first magnetic material by at least 2 times relative to an etch rate thereof in an absence of the vapor.

* * * * *